United States Patent
Teichert et al.

(10) Patent No.: US 9,328,410 B2
(45) Date of Patent: May 3, 2016

(54) PHYSICAL VAPOR DEPOSITION TILE ARRANGEMENT AND PHYSICAL VAPOR DEPOSITION ARRANGEMENT

(71) Applicants: VON ARDENNE GmbH, Dresden (DE); First Solar, Inc., Perrysburg, OH (US)

(72) Inventors: Bernd Teichert, Dresden (DE); Klaus Schneider, Arnsdorf (DE); Christoph Kaiser, Dresden (DE); Michael Rivkin, Los Altos, CA (US); George Arthur Proulx, Castro Valley, CA (US)

(73) Assignees: First Solar, Inc., Perrysburg, OH (US); VON ARDENNE GmbH, Dresden (DE)

( * ) Notice: Subject to any disclaimer, the term of this patent is extended or adjusted under 35 U.S.C. 154(b) by 0 days.

(21) Appl. No.: 14/062,959

(22) Filed: Oct. 25, 2013

(65) Prior Publication Data
US 2015/0114824 A1    Apr. 30, 2015

(51) Int. Cl.
  C23C 14/34    (2006.01)
  H01J 37/34    (2006.01)
  C23C 14/35    (2006.01)
  C23C 14/08    (2006.01)

(52) U.S. Cl.
  CPC ............ *C23C 14/3407* (2013.01); *C23C 14/35* (2013.01); *H01J 37/3414* (2013.01); *H01J 37/3417* (2013.01); *H01J 37/3432* (2013.01); *C23C 14/086* (2013.01)

(58) Field of Classification Search
  CPC  H01J 37/3417; H01J 37/3414; H01J 37/3432

USPC ........................... 204/298.12, 192.15
See application file for complete search history.

(56) References Cited

U.S. PATENT DOCUMENTS

| | | | |
|---|---|---|---|
| 4,198,283 A * | 4/1980 | Class et al. ............... | 204/298.12 |
| 4,200,510 A | 4/1980 | O'Connell et al. | |
| 4,560,462 A | 12/1985 | Radford et al. | |
| 4,572,776 A | 2/1986 | Aichert et al. | |
| 5,421,978 A | 6/1995 | Schuhmacher et al. | |
| 6,068,742 A | 5/2000 | Daxinger et al. | |
| 6,689,254 B1 | 2/2004 | Hurwitt | |
| 7,811,429 B2 | 10/2010 | Landgraf et al. | |

(Continued)

FOREIGN PATENT DOCUMENTS

| | | |
|---|---|---|
| CA | 1141704 A1 | 2/1983 |
| DE | 2920780 A1 | 3/1980 |

(Continued)

OTHER PUBLICATIONS

Office Action received for German Patent Application No. 10 2013 100 382.6, dated Sep. 6, 2013 (for information purposes only), 5 pages.

(Continued)

*Primary Examiner* — Jason M Berman
(74) *Attorney, Agent, or Firm* — Viering, Jentschura & Partner mbB

(57) ABSTRACT

In various embodiments, a physical vapor deposition tile arrangement is provided. The physical vapor deposition tile arrangement may include a plurality of physical vapor deposition tiles arranged next to each other; and a resilient structure configured to press the plurality of physical vapor deposition tiles together.

19 Claims, 14 Drawing Sheets

Springs (cold target) 302    Target Tiles 300    Tile Arrangement 304

(56) References Cited

U.S. PATENT DOCUMENTS

| | | |
|---|---|---|
| 2005/0224342 A1 | 10/2005 | Landgraf et al. |
| 2010/0252418 A1* | 10/2010 | McCabe et al. .......... 204/192.15 |
| 2011/0005924 A1* | 1/2011 | Schnappenberger et al. ................ 204/298.12 |

FOREIGN PATENT DOCUMENTS

| | | |
|---|---|---|
| DE | 3009836 A1 | 9/1980 |
| DE | 4301516 A1 | 7/1994 |
| DE | 29615533 U1 | 2/1997 |
| DE | 10018858 A1 | 10/2001 |
| DE | 102005019101 A1 | 10/2006 |
| EP | 0144572 B1 | 10/1989 |
| EP | 0166256 B1 | 8/1990 |
| WO | 2004007791 A1 | 1/2004 |

OTHER PUBLICATIONS

Office Action received for German Patent Application No. 10 2013 112 861.0, dated Jun. 3, 2014 (for information purposes only), 6 pages.

* cited by examiner

Springs (cold target) 302    Target Tiles 300    Tile Arrangement 304

Springs (hot target) 302    Target Tiles 300    Tile Arrangement 304

Leaf Springs 502   Target Tiles 500

PHYSICAL VAPOR DEPOSITION TILE ARRANGEMENT AND PHYSICAL VAPOR DEPOSITION ARRANGEMENT

TECHNICAL FIELD

Various embodiments relate generally to a physical vapor deposition tile arrangement and a physical vapor deposition arrangement.

BACKGROUND

A planar magnetron usually includes a magnetic system, a cooling system to dissipate the heat of the a physical vapor deposition, or "sputtering" process, and a target. The magnetron target is typically indirectly cooled by the cooling system, wherein the target is pressed against a heat sink which has water flowing through it. In some applications, the target can be cooled directly by the cooling system. In still other processes it may be necessary that the target material is not cooled and thus the target reaches a much higher temperature during the sputtering process. These processes may use the higher target temperature to obtain, for example, a more stable sputter process by reducing the formation of particles or "nodules" on the target surface. In high target temperature applications, the target is subject to thermal expansion. This thermal expansion may cause movement or slippage of the target. In the case that the target is composed of a plurality of adjacent parts, for example tiles, the thermal expansion can cause gaps between the tiles. These gaps expose the material under or behind the target to ion bombardment, which leads to contamination of the a sputtered films being produced in the a physical vapor deposition process.

SUMMARY

In various embodiments, a physical vapor deposition tile arrangement is provided. The physical vapor deposition tile arrangement may include a plurality of physical vapor deposition tiles arranged next to each other; and a resilient structure configured to press the plurality of physical vapor deposition tiles together.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 3A is configured for a cold target; FIG. 3B for a hot target.

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The current disclosure provides for a magnetron and a target carrier for uncooled targets which are well suited for both narrow and wide targets.

Figure 1A:
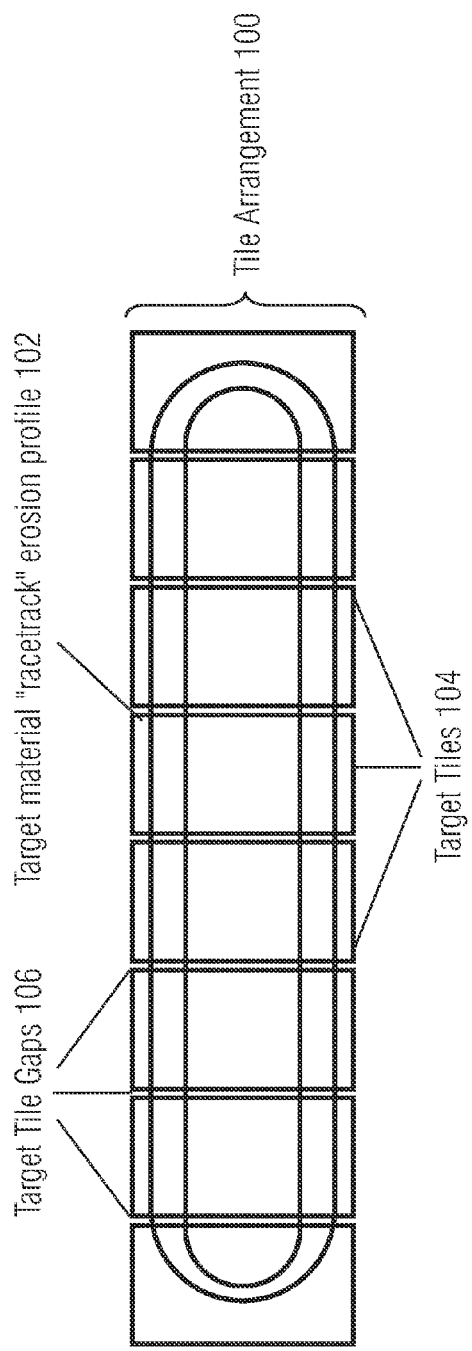
FIG. 1A shows a target tile arrangement, according to various embodiments, with continuous tiles over the front and back sides of the racetrack.
Figure 1B:
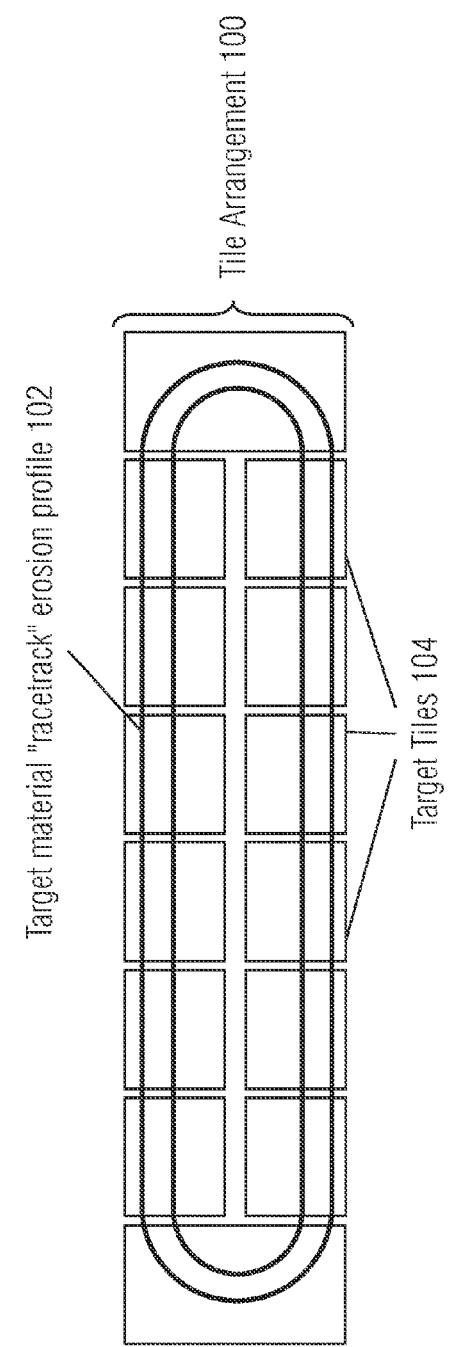
FIG. 1B shows a target tile arrangement, according to various embodiments, with separated tiles over the racetrack.

The current disclosure provides a physical vapor deposition target-tile carrier. According to various embodiments, it is possible to provide a physical vapor deposition tile system that prevents gaps from forming between the tiles due to thermal cycling. FIG. 1A illustrates a physical vapor deposition target arrangement 100 with contiguous tiles 104, a sputter material erosion groove or "racetrack" 102, and tile gaps 106. FIG. 1B illustrates a physical vapor deposition target arrangement 100 with separate, individual tiles 104, a sputter material erosion groove or "racetrack" 102, and tile gaps 106.

According to an embodiment, a physical vapor deposition tile arrangement 100 containing a plurality of physical vapor deposition tiles arranged next to each other and a resilient structure configured to press the plurality of physical vapor deposition tiles together is provided.

Figure 2A:
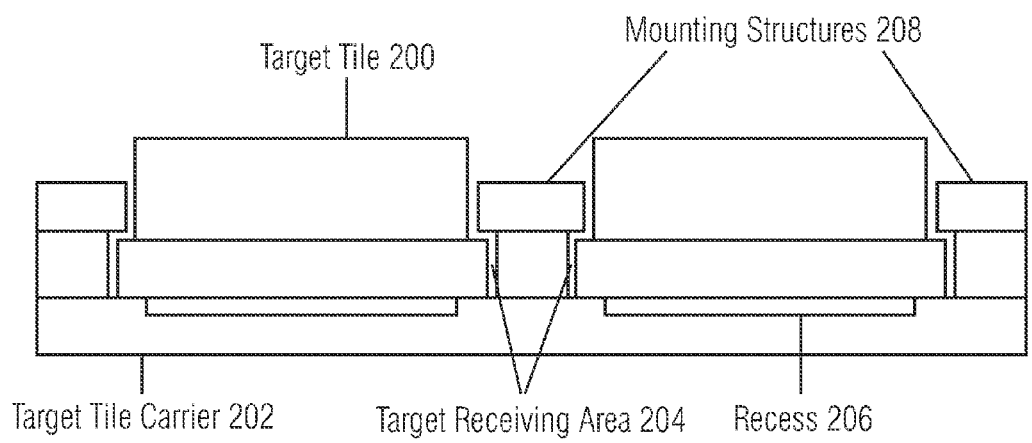
FIG. 2A shows a cross section of the target tile arrangement shown in FIG. 1B where the target tiles are resting on the mounting plate and configured for a sputter up process.

According to an embodiment, the physical vapor deposition tile arrangement may be configured as illustrated in FIG. 2A, where the target tile carrier 202 has at least one target receiving area 204 for receiving the target, and a recess below the target 206, and mounting structures 208 which may hold the physical vapor deposition target tile 200 in the target receiving area 204. As shown in FIG. 2A, the target tiles 200 may be arranged so that they rest on carrier 202 in the target receiving area 204. In this configuration, the physical vapor deposition tiles 200 are arranged for a "sputter up" process.

Figure 2B:
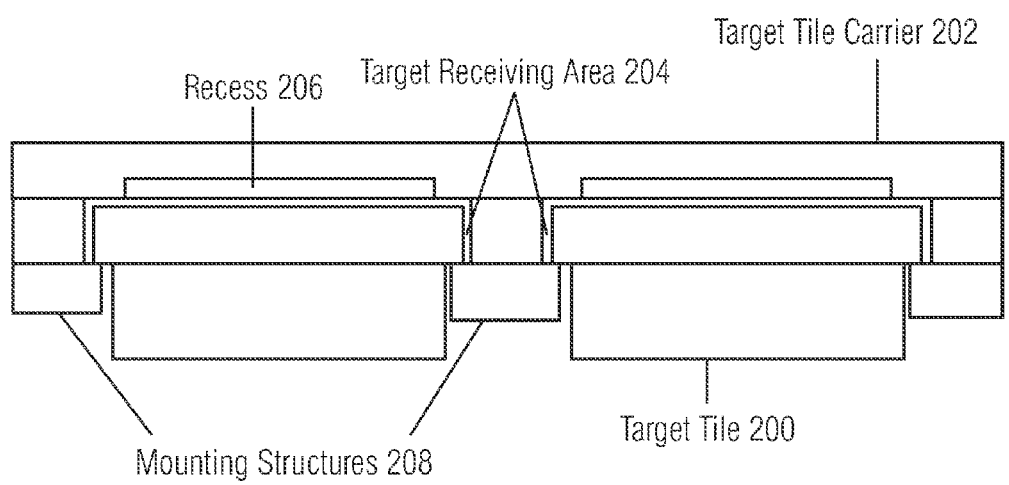
FIG. 2B shows a cross section of the target tile arrangement shown in FIG. 1B where the target tiles are resting against the mounting bar and configured for a sputter down process.

According to an embodiment, the physical vapor deposition tile arrangement may be configured as illustrated in FIG. 2B, where the target tile carrier 202 has at least one target receiving area 204 for receiving the target, and a recess below the target 206, and mounting structures 208 which may hold the physical vapor deposition target tile 200 in the target receiving area 204. As shown in FIG. 2B, the target tiles 200 may be arranged so that they rest on mounting structures 208 in the target receiving area 204. In this configuration, the physical vapor deposition tiles 200 are arranged for a "sputter down" process.

Figure 2C:
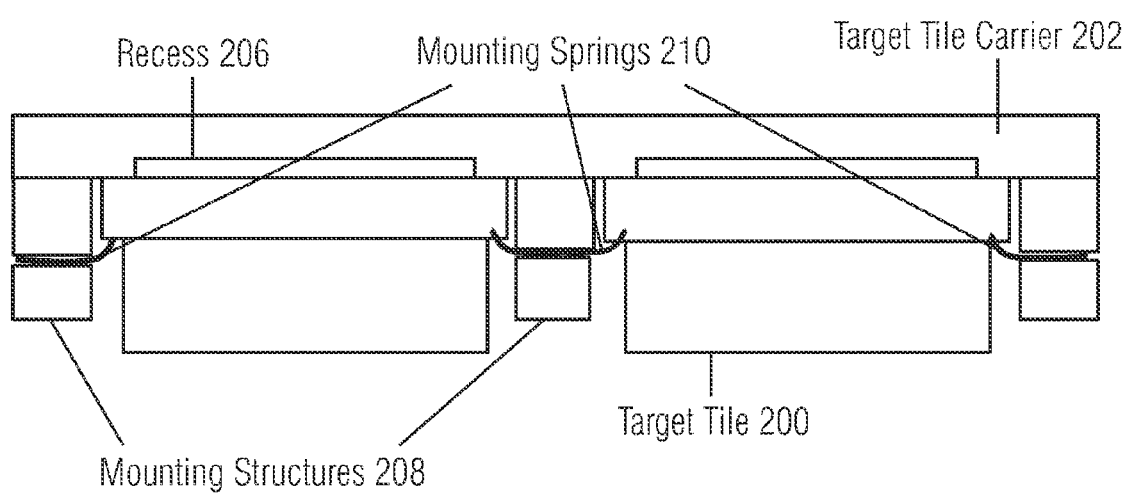
FIG. 2C shows a cross section of the target tile arrangement shown in FIG. 1B where the target tiles are pressed against the mounting plate by springs and configured for a sputter down process.

According to an embodiment, the physical vapor deposition tile arrangement may be configured as illustrated in FIG. 2C, where the target tile carrier 202 has at least one target receiving area 204 for receiving the target, and a recess below the target 206, and mounting structures 208 which may hold the physical vapor deposition target tile 200 in the target receiving area 204. As shown in FIG. 2C, the target tiles 200 may be arranged so that they are pressed against carrier 202 by mounting springs 210 in the target receiving area 204. In this configuration, the physical vapor deposition tiles 200 are arranged for a "sputter down" process. Moreover, the mounting springs could hold the tiles in defined position for a "vertical sputtering" process.

According to an embodiment, at least one of the physical vapor deposition tiles may be composed of a material to be deposited on a substrate. Some physical vapor deposition target tile materials may include, e.g.: ITO, ZnO, ZnTe, CdS, however, the physical vapor deposition target-tile carrier may be configured to accommodate any type of target tile necessary for a given application.

According to an embodiment, the target tile may have a central portion which may be thicker than an edge region.

According to an embodiment, carrier 202 may have a recess 206 and target 200 may be partially received in the recess. In this case the target can be incorporated into the recess 206 until the thickness of the edge region and the remainder of the target 200 may extend out of the recess.

According to an embodiment, the plurality of physical vapor deposition tiles may be sputter target tiles. The sputter target tiles may be composed of one or more of the following: gold, silver, titanium, tantalum, zinc, tin, at least one oxide or di-oxide, at least one nitride or di-nitride, or any other material with the desired characteristic for a given application. In various embodiments, the sputter target tiles may be composed of one or more of the following materials: ITO, ZnO, ZnTe, CdS.

According to an embodiment, the resilient structure may be arranged at an edge of the physical vapor deposition tiles as illustrated in FIGS. 3 to 7.

According to an embodiment, the resilient structure may be at least one spring, wherein the spring may have a stiffness in the range from about 1 N/mm to about 15 N/mm, e.g. in the range from about 3 N/mm to about 9 N/mm.

According to an embodiment, the resilient structure may be in physical contact with only one side of physical vapor deposition tile as illustrated, for example, in FIG. 2C where the target tiles 200 are pressed against the mounting plate 202 by mounting springs 210.

Figure 3A:
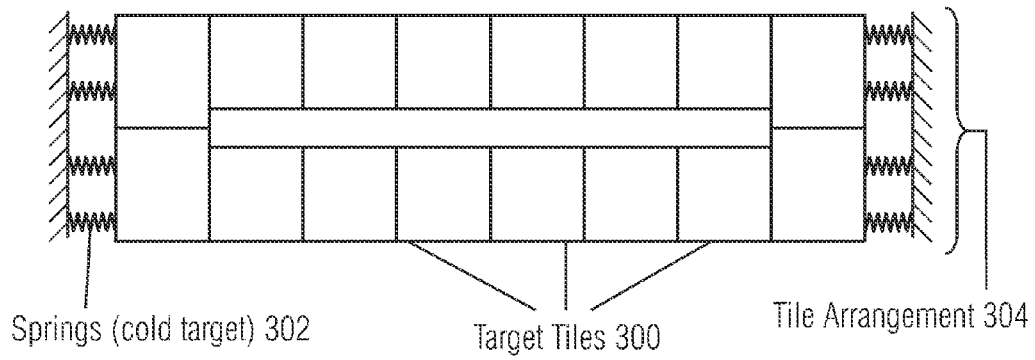
FIGS. 3A and 3B show a top-down view of the target tile arrangement, according to various embodiments, with springs used to apply pressure to the tiles, where
Figure 3B:
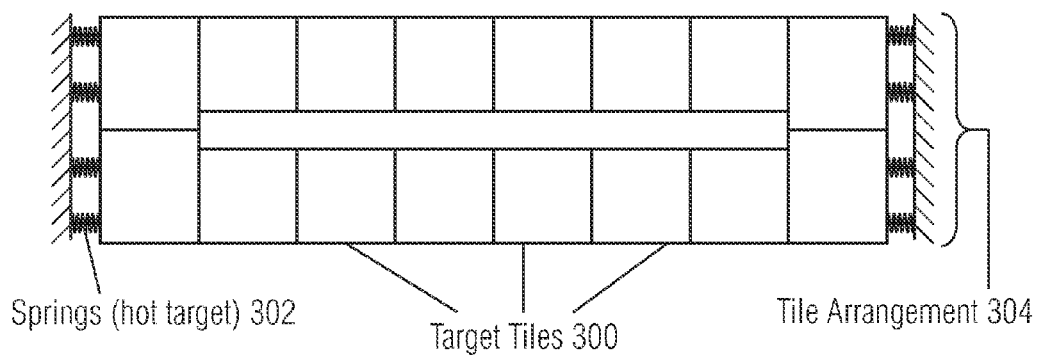

According to an embodiment, it is possible to marginalize or eliminate the gaps formed due to thermal cycling when multiple adjacent target tiles are used. As shown in FIG. 3A, when the target is cool, i.e. before the vapor deposition process, it is necessary for the springs to be in a more extended position. However, as illustrated in FIG. 3B, when the target is hot, i.e. during the vapor deposition process, the target tiles expand and compress the springs. By selecting the appropriate spring tensions, it is possible to keep the target tiles in very close contact despite the thermal cycling inherent in the vapor deposition process.

Figure 4:
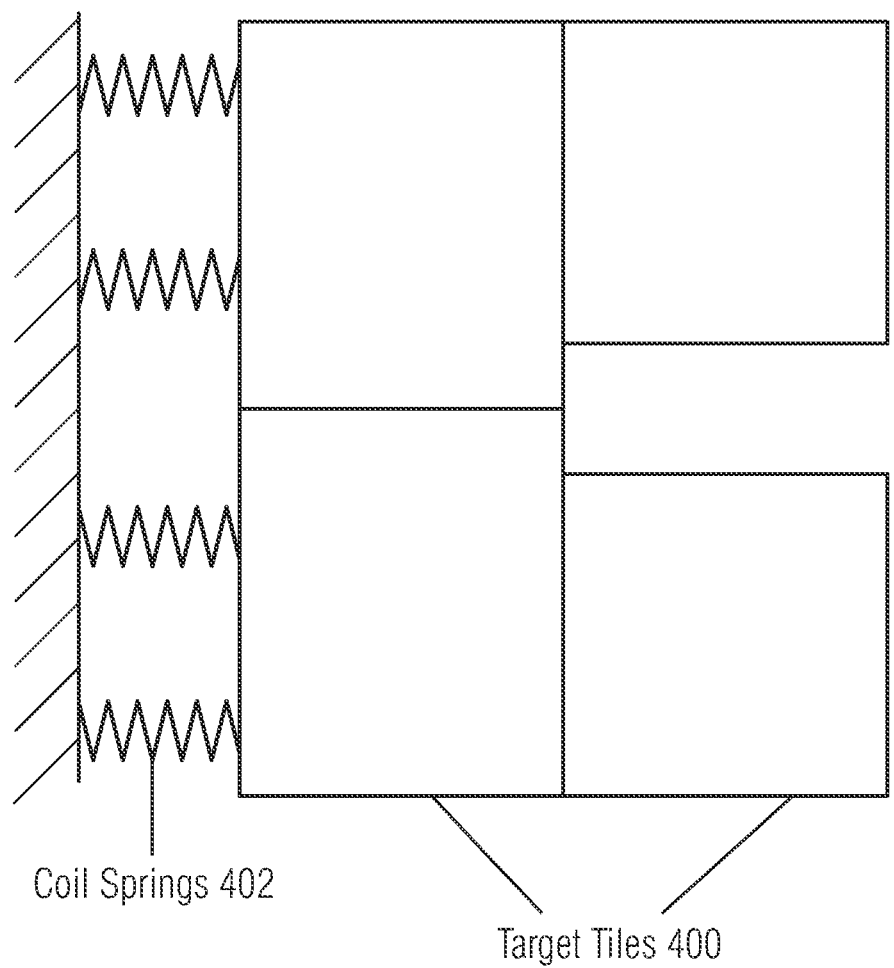
FIG. 4 shows an end region of the target tile arrangement where, according to various embodiments, compression coil springs are used to apply pressure to the tiles.

According to an embodiment, as illustrated in FIG. 4, the resilient structure may include or be at least one coil spring 402, wherein the spring may have a stiffness in the range from about 1 N/mm to about 180 N/mm, e.g. in the range from about 2 N/mm to about 20 N/mm and may be composed of one or more of the following materials such as e.g. an austenitic steel (e.g. X5CrNiMo171-12-2; 1.4401), a nickel base alloy (e.g. Inconel X750), a cobalt base alloy, and the like. In various embodiments, spring material for high operating temperatures and having low or even no ferromagnetism.

Figure 5:
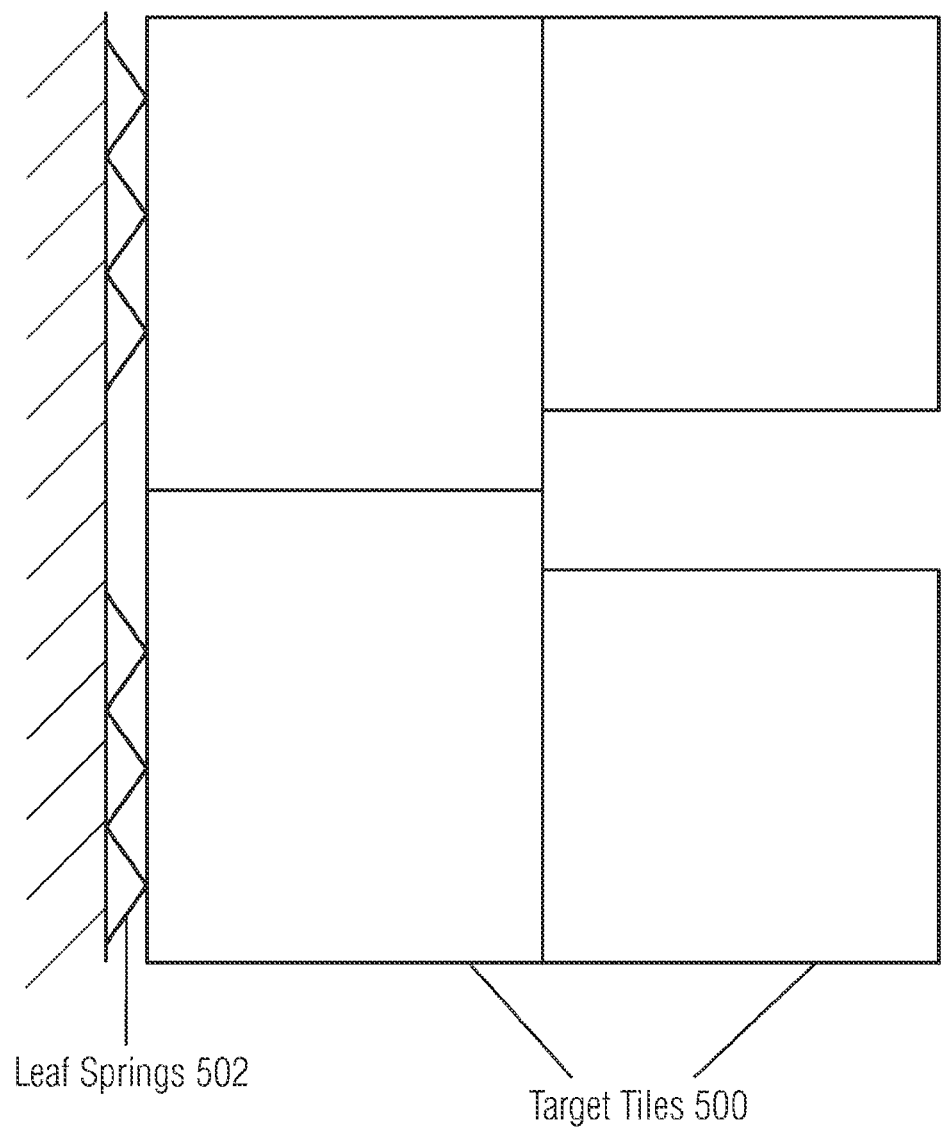
FIG. 5 shows an end region of the target tile arrangement where, according to various embodiments, leaf springs are used to compress the tiles.

According to an embodiment, as illustrated in FIG. 5, the resilient structure may include or be at least one leaf spring 502, wherein the spring may have a stiffness in the range from about 1 N/mm to about 180 N/mm, e.g. in the range from about 2 N/mm to about 20 N/mm and may be composed of one or more of the following materials such as e.g. an austenitic steel (e.g. X5CrNiMo171-12-2; 1.4401), a nickel base alloy (e.g. Inconel X750), a cobalt base alloy, and the like. In various embodiments, spring material for high operating temperatures and having low or even no ferromagnetism.

Figure 6:
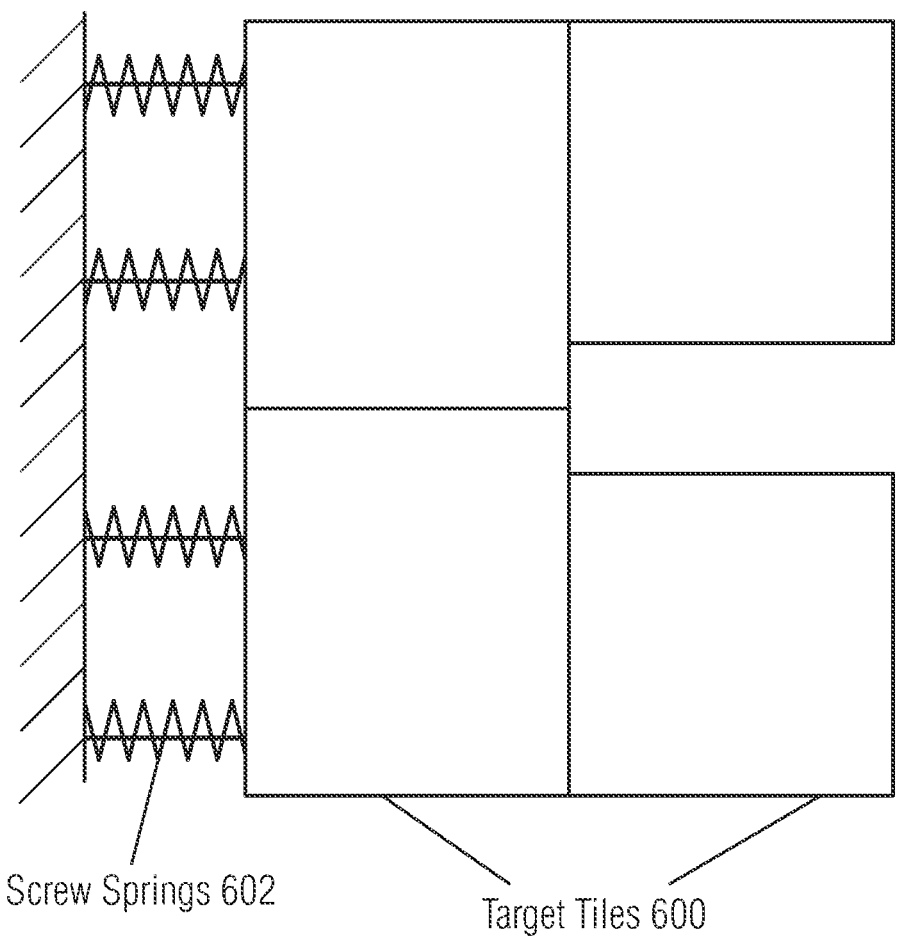
FIG. 6 shows an end region of the target tile arrangement where, according to various embodiments, according to various embodiments, screw springs are used to compress the tiles.

According to an embodiment, as illustrated in FIG. 6, the resilient structure may include or be at least one screw spring 602, wherein the spring may have a stiffness in the range from about 1 N/mm to about 180 N/mm, e.g. in the range from about 2 N/mm to about 20 N/mm and may be composed of one or more of the following materials such as e.g. an austenitic steel (e.g. X5CrNiMo171-12-2; 1.4401), a nickel base alloy (e.g. Inconel X750), a cobalt base alloy, and the like. In various embodiments, spring material for high operating temperatures and having low or even no ferromagnetism.

Figure 8:
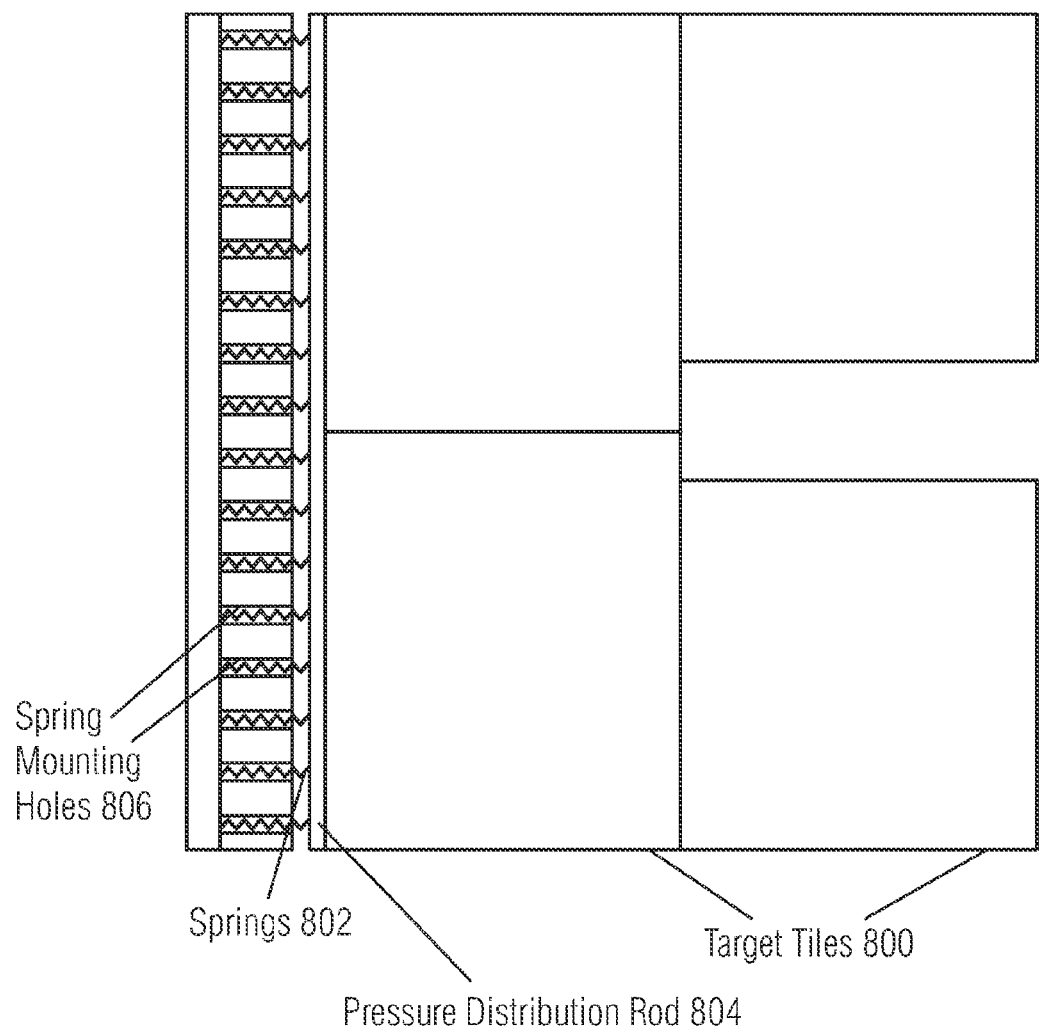
FIG. 8 shows an embodiment where the springs are mounted into holes in and end region of the mounting plate and a pressure distribution bar is attached to the mounting plate and arranged between the springs and the target tiles. According to various embodiments, the tension of the springs may be adjusted after they are placed in between the mounting plate and the pressure distribution bar.

According to an embodiment, as illustrated in FIG. 8, a physical vapor deposition tile arrangement containing a plurality of physical vapor deposition tiles 800 arranged next to each other; a resilient structure 802 configured to press the plurality of physical vapor deposition tiles 800 together; and a pressure distribution structure 804 arranged between the resilient structure 802 and the plurality of physical vapor deposition tiles 800 to distribute the pressure provided by the resilient structure 802 to the plurality of physical vapor deposition tiles 800. The resilient structure 802 may be at least one spring or a plurality of springs as illustrated in FIG. 8. The spring or springs may be mounted into mounting holes 806. The mounting holes 806 may be formed at approximately regular intervals along an edge of the physical vapor deposition tile arrangement in order to provide the pressure required to keep the tiles 800 pressed together in a given application.

Figure 7:
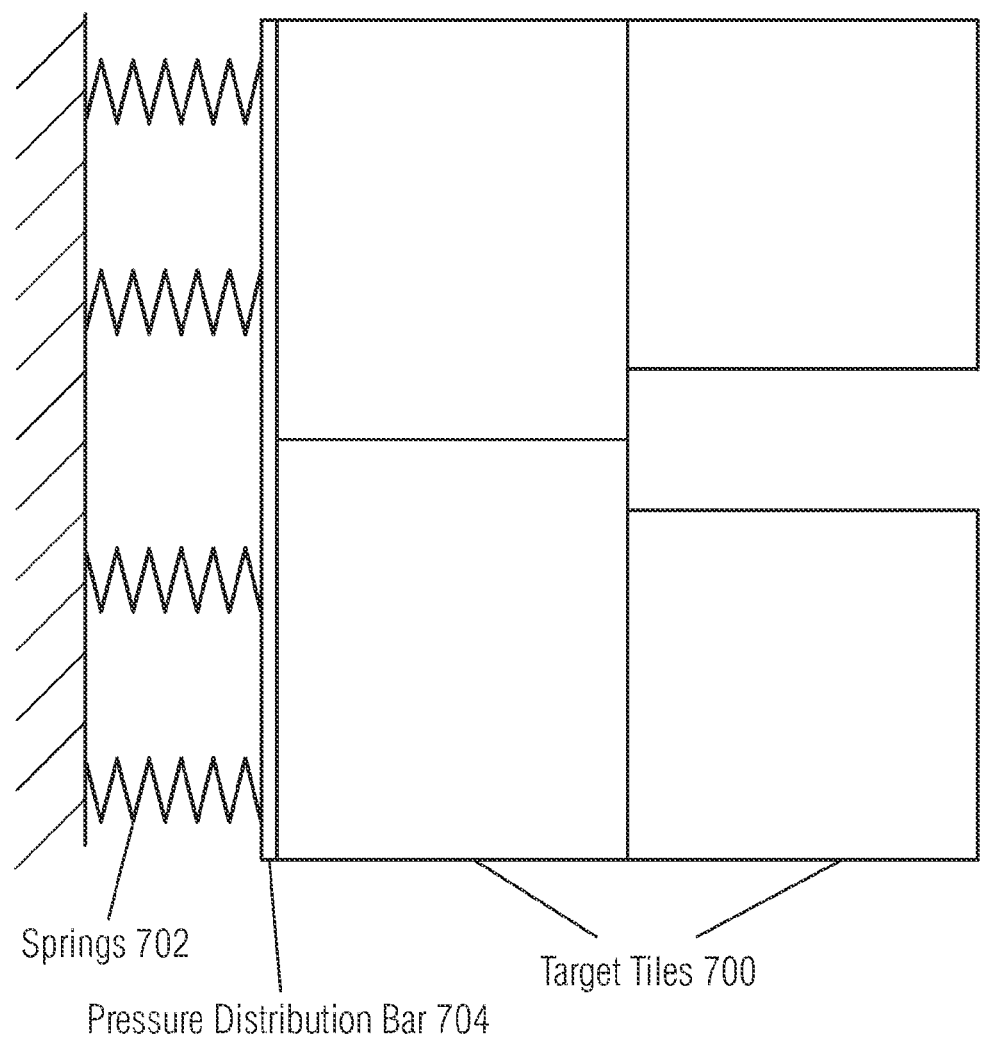
FIG. 7 shows an end region of the target tile arrangement where, springs and a pressure distribution bar are used to apply pressure to the tiles.

According to an embodiment, the pressure distribution structure may be a pressure distribution rod 704, as illustrated in FIG. 7.

According to an embodiment, the pressure distribution structure may be formed from, for example, from one or more of the following materials: one or more non-magnetic steels or e.g. Mo. Furthermore, a material having low or even no ferromagnetism and/or low thermal conductivity, in order to avoid a too high heat emission to the springs may be provided in this case. In various embodiments, a soft or flexible material may be provided. Such a material may e.g. include an austenitic steel, such as e.g. X2CrNiMo171-12-2 (1.4404), or a titanium alloy such as e.g. $Ti_3Al$.

Figure 9:
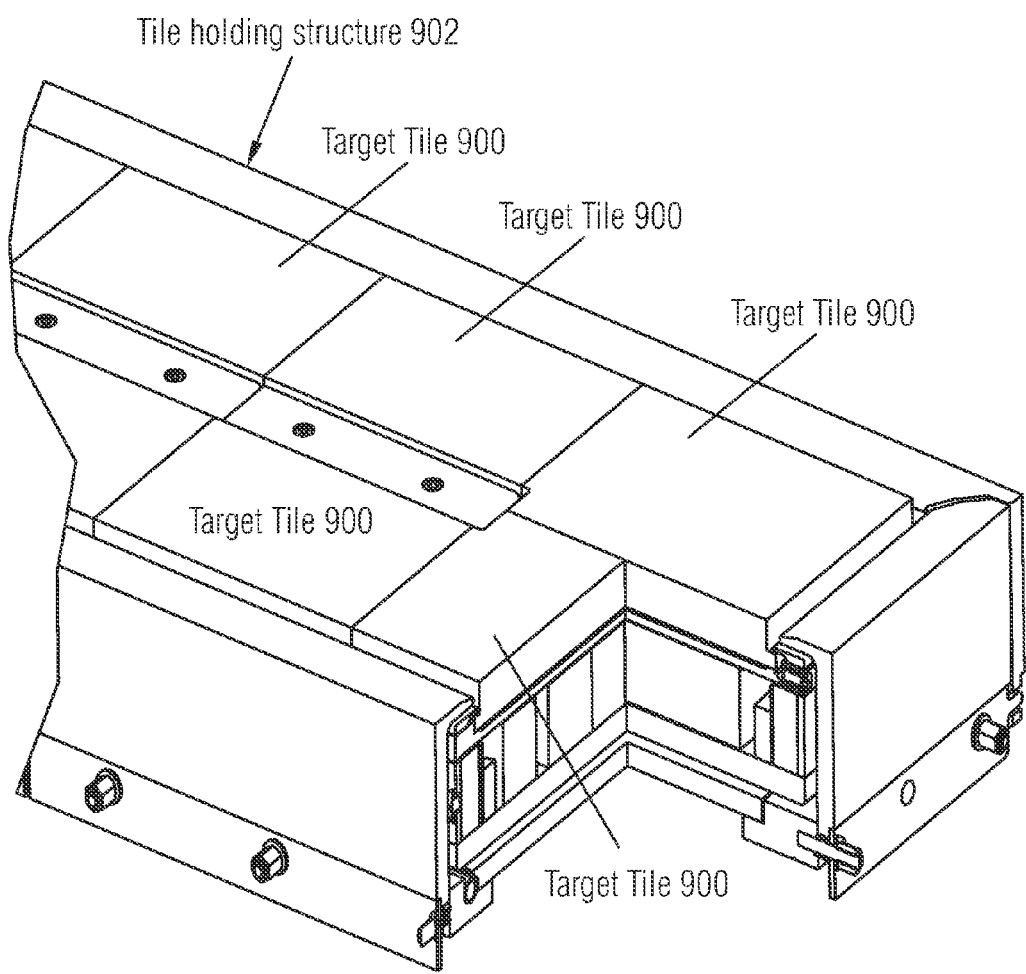
FIG. 9 shows an embodiment of the physical vapor deposition tile arrangement containing a plurality of physical vapor deposition tiles arranged next to each other and a tile holding structure configured to hold the plurality of physical vapor deposition tiles through the use of a resilient structure or structures.

According to an embodiment, the physical vapor deposition tile arrangement contains a plurality of physical vapor deposition tiles 900 arranged next to each other; a resilient structure configured to press the plurality of physical vapor deposition tiles 900 together; and a tile holding structure 902 configured to hold the plurality of physical vapor deposition tiles 900 may be configured as illustrated in FIG. 9.

According to an embodiment, the resilient structure is configured to provide pressure to the plurality of physical vapor deposition tiles to overcome the holding force provided by the tile holding structure to hold the plurality of physical vapor deposition tiles in a holding position.

In a further embodiment, a physical vapor deposition arrangement containing a physical vapor deposition process chamber; a physical vapor deposition tile arrangement with a plurality of physical vapor deposition tiles arranged next to each other and a resilient structure configured to press the plurality of physical vapor deposition tiles together.

Figure 10:
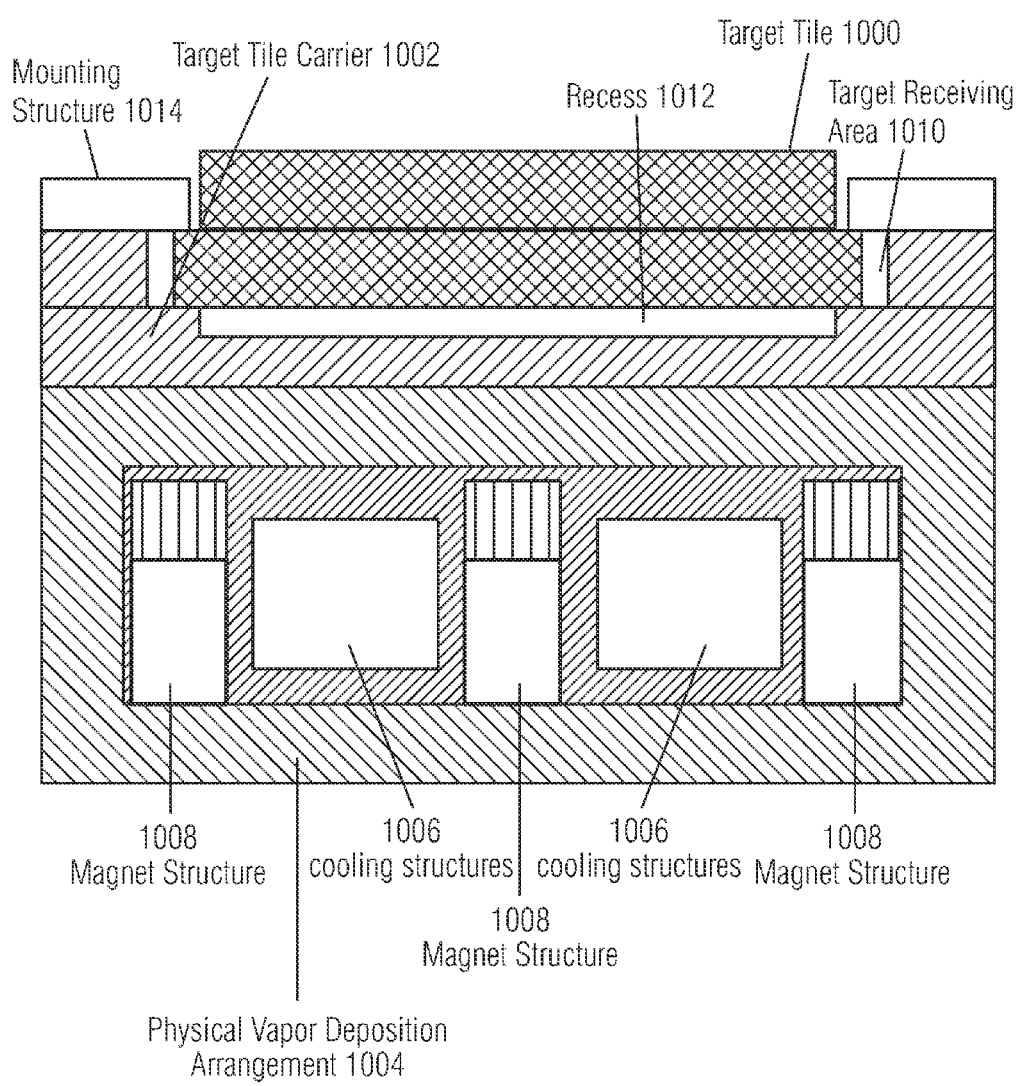
FIG. 10. shows a cross-sectional view of an embodiment of the physical vapor deposition arrangement with a physical vapor deposition process chamber which may be used in conjunction with the target tile arrangement, according to various embodiments of the disclosure.

According to an embodiment, as illustrated in FIG. 10, a physical vapor deposition arrangement 1004 is provided, wherein the carrier 1002 has a target receiving area 1010 for receiving the target 1000, and a recess below the target 1012, and mounting structures 1014 which may hold the physical vapor deposition target tile 1000 in the target receiving area 1010.

According to an embodiment, physical vapor deposition arrangement 1004 may further include a cooling structure 1006, where the carrier 1002 is located between the target 1000 and the cooling structure 1006.

According to an embodiment, the physical vapor deposition arrangement 1004 may be a sputter process chamber.

According to an embodiment, the physical vapor deposition arrangement 1004 may be a magnetron.

According to an embodiment, the magnetron may further comprise a magnetic structure 1008, wherein carrier 1002 is located between the magnet structure 1008 and the target 1000.

According to an embodiment, the physical vapor deposition arrangement 1004 may be a planar magnetron arranged for sputtering processes without the use of electromagnetic radiation in the microwave spectrum.

According to an embodiment, mounting structures 1014 may be springs (not shown in FIG. 10) with a tension of e.g. 0.2 N/mm to 1.5 N/mm.

According to an embodiment, mounting structures 1014 may be spring clamps.

Figure 11:
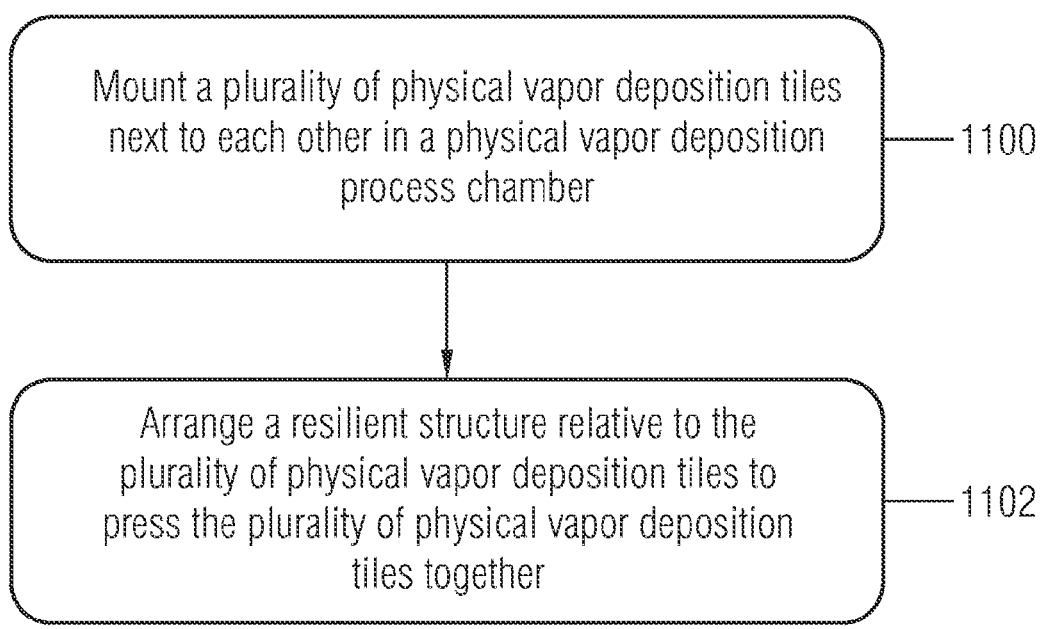
FIG. 11 illustrates an example process flow for mounting a plurality of physical vapor deposition tiles in a physical vapor deposition process chamber and arranging a resilient structure relative to the plurality of physical vapor deposition tiles to press the plurality of physical vapor deposition tiles together.

FIG. 11 illustrates an example process flow for mounting a plurality of physical vapor deposition tiles in a physical vapor deposition process chamber and arranging a resilient structure relative to the plurality of physical vapor deposition tiles to press the plurality of physical vapor deposition tiles together.

Thus, according to an embodiment, a method of mounting a plurality of physical vapor deposition tiles in a physical vapor deposition process chamber is provided. The method may involve, in 1100, arranging the plurality of physical vapor deposition tiles in the physical vapor deposition process chamber next to each other; and, in 1102, arranging a resilient structure relative to the plurality of physical vapor deposition tiles to press the plurality of physical vapor deposition tiles together.

Figure 12:
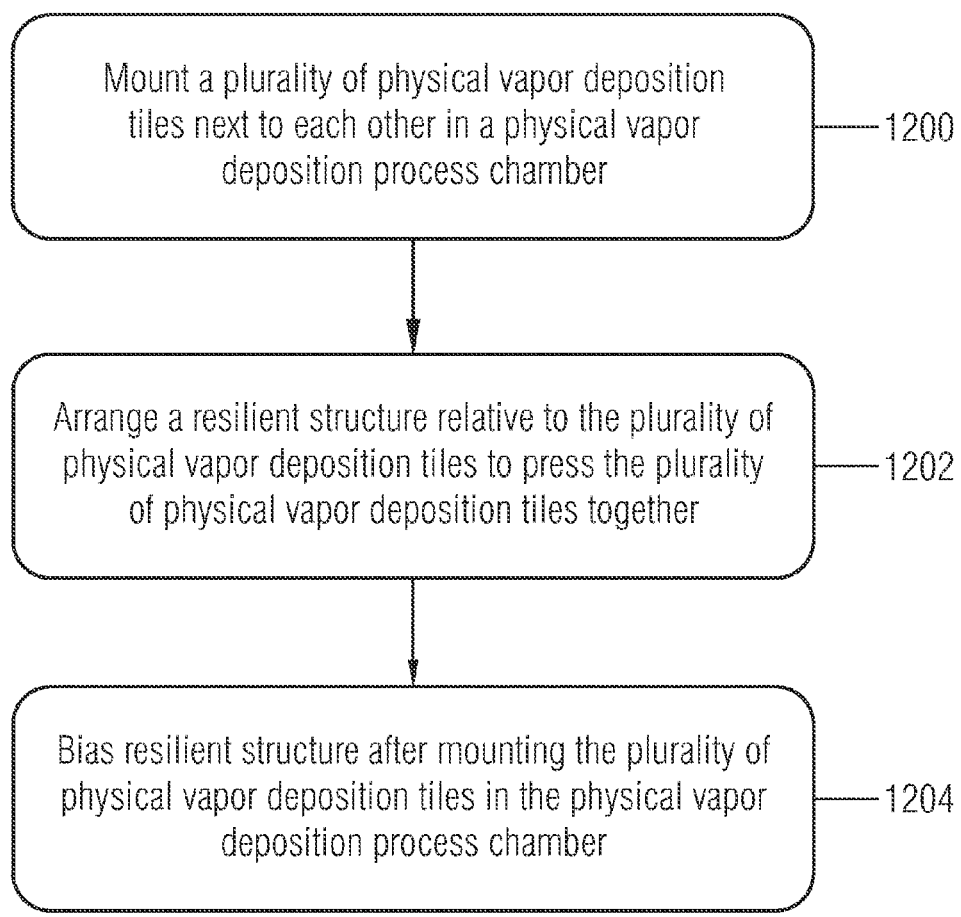
FIG. 12 illustrates an example process flow for mounting a plurality of physical vapor deposition tiles in a physical vapor deposition process chamber and arranging a resilient structure relative to the plurality of physical vapor and biasing the force applied by resilient structure after the vapor deposition tiles are mounted.

FIG. 12 illustrates an example process flow for mounting a plurality of physical vapor deposition tiles in a physical vapor deposition process chamber and arranging a resilient structure relative to the plurality of physical vapor and biasing the force applied by resilient structure after the vapor deposition tiles are mounted.

The method may involve, in 1200, arranging the plurality of physical vapor deposition tiles in the physical vapor deposition process chamber next to each other; and, in 1202, arranging a resilient structure relative to the plurality of physical vapor deposition tiles to press the plurality of physical vapor deposition tiles together. The resilient structure used to press the plurality of physical vapor deposition tiles together may be biased after arranging the plurality of physical vapor deposition tiles in the physical vapor deposition process chamber to account for expansion and contraction of the tiles due to thermal cycling during the sputtering process (in 1206).

Figure 13:
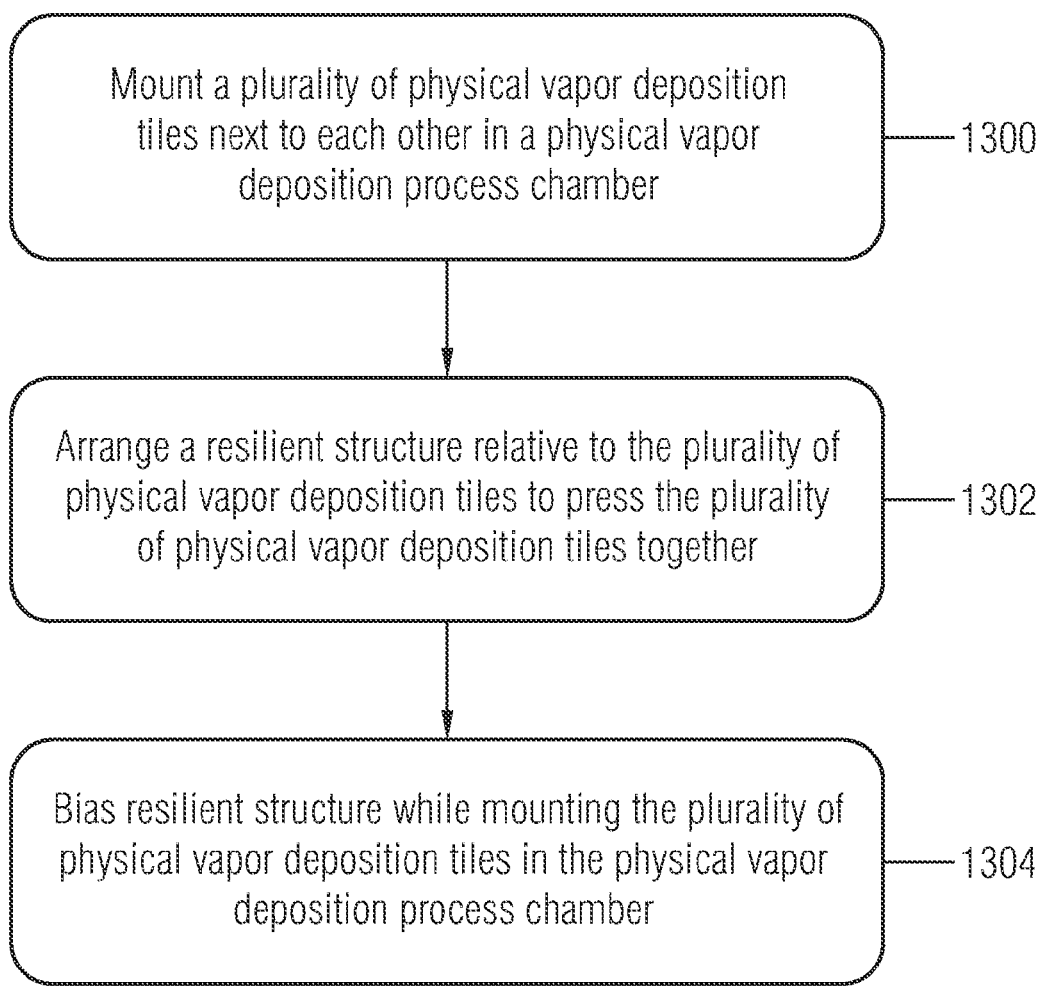
FIG. 13 illustrates an example process flow for mounting a plurality of physical vapor deposition tiles in a physical vapor deposition process chamber and arranging a resilient structure relative to the plurality of physical vapor and biasing the force applied by resilient structure while the vapor deposition tiles are being mounted.

FIG. 13 illustrates an example process flow for mounting a plurality of physical vapor deposition tiles in a physical vapor deposition process chamber and arranging a resilient structure relative to the plurality of physical vapor and biasing the force applied by resilient structure while the vapor deposition tiles are being mounted.

The method may involve, in 1300, arranging the plurality of physical vapor deposition tiles in the physical vapor deposition process chamber next to each other; and, in 1302, arranging a resilient structure relative to the plurality of physical vapor deposition tiles to press the plurality of physical vapor deposition tiles together. The resilient structure used to press the plurality of physical vapor deposition tiles together may be biased while arranging the plurality of physical vapor deposition tiles in the physical vapor deposition process chamber to account for expansion and contraction of the tiles due to thermal cycling during the sputtering process (in 1306).

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A physical vapor deposition tile arrangement, comprising:
   a plurality of planar physical vapor deposition tiles arranged next to each other; and
   a resilient structure comprising at least one spring, wherein the resilient structure is configured so that at least two of the plurality of planar physical vapor deposition tiles are pressed against each other by the at least one spring.

2. The physical vapor deposition tile arrangement of claim 1,
   wherein at least one planar physical vapor deposition tile of the plurality of planar physical vapor deposition tiles comprises material to be deposited on a substrate.

3. The physical vapor deposition tile arrangement of claim 1,
   wherein the plurality of planar physical vapor deposition tiles are planar sputter target tiles.

4. The physical vapor deposition tile arrangement of claim 1,
   wherein the resilient structure is arranged at an edge of at least one of the plurality of planar physical vapor deposition tiles.

5. The physical vapor deposition tile arrangement of claim 4,
   wherein the resilient structure is arranged at an edge of the physical vapor deposition tile arrangement.

6. The physical vapor deposition tile arrangement of claim 1,
   wherein the resilient structure is in physical contact with only one side of the physical vapor deposition tile arrangement.

7. The physical vapor deposition tile arrangement of claim 1,
   wherein the at least one spring comprises at least one screw spring.

8. The physical vapor deposition tile arrangement of claim 1,
   wherein the at least one spring comprises at least one leaf spring.

9. The physical vapor deposition tile arrangement of claim 1, further comprising:
   a pressure distribution structure arranged between the resilient structure and the plurality of planar physical vapor deposition tiles to distribute the pressure provided by the resilient structure to the plurality of planar physical vapor deposition tiles.

10. The physical vapor deposition tile arrangement of claim 1,
    wherein the pressure distribution structure comprises a pressure distribution rod.

11. The physical vapor deposition tile arrangement of claim 1, further comprising:
    a tile holding structure configured to hold the plurality of planar physical vapor deposition tiles.

12. The physical vapor deposition tile arrangement of claim 11,
    wherein the resilient structure is configured to provide a pressure to the plurality of planar physical vapor deposition tiles to overcome a holding force provided by the tile holding structure to hold the plurality of planar physical vapor deposition tiles in a holding position.

13. A physical vapor deposition arrangement, comprising:
    a physical vapor deposition process chamber; and
    a physical vapor deposition tile arrangement, comprising:
        a plurality of planar physical vapor deposition tiles arranged next to each other; and
        a resilient structure comprising at least one spring, wherein the resilient structure is configured so that at least two of the plurality of planar physical vapor deposition tiles are pressed against each other by the at least one spring.

14. The physical vapor deposition arrangement of claim 13,
    wherein the physical vapor deposition process chamber is a sputter process chamber.

15. The physical vapor deposition arrangement of claim 13, further comprising:
    a magnetron.

16. The physical vapor deposition arrangement of claim 15,
    wherein the magnetron is a planar magnetron.

17. A method of mounting a plurality of planar physical vapor deposition tiles in a physical vapor deposition process chamber, the method comprising:
    arranging the plurality of planar physical vapor deposition tiles in the physical vapor deposition process chamber next to each other;
    arranging a resilient structure relative to the plurality of planar physical vapor deposition tiles, the resilient structure comprising at least one spring, and
    pressing at least two of the plurality of physical vapor deposition tiles against each other by the at least one spring.

18. The method of claim 17,
    wherein the resilient structure is biased after arranging the plurality of planar physical vapor deposition tiles in the physical vapor deposition process chamber.

19. The method of claim 17,
    wherein the resilient structure is biased during arranging the plurality of planar physical vapor deposition tiles in the physical vapor deposition process chamber.

* * * * *